(12) United States Patent
Tajima

(10) Patent No.: US 7,888,268 B2
(45) Date of Patent: Feb. 15, 2011

(54) METHOD OF FORMING A GATE LAYER WITH MULTIPLE ECTHING STEPS

(75) Inventor: Mitsugu Tajima, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 448 days.

(21) Appl. No.: 12/052,195

(22) Filed: Mar. 20, 2008

(65) Prior Publication Data

US 2008/0230816 A1      Sep. 25, 2008

(30) Foreign Application Priority Data

Mar. 20, 2007    (JP) ............................... 2007-072343

(51) Int. Cl.
*H01L 21/302* (2006.01)
*H01L 21/461* (2006.01)
*H01L 21/336* (2006.01)

(52) U.S. Cl. ...................... 438/714; 438/301; 438/738; 257/E21.637

(58) Field of Classification Search ................. 438/714, 438/305, 306, 301, 738; 257/E21.635, E21.637
See application file for complete search history.

(56) References Cited

U.S. PATENT DOCUMENTS 6,103,603 A  *  8/2000  Han ............................ 438/532

| 6,583,065 | B1 | 6/2003 | Williams et al. | |
|---|---|---|---|---|
| 7,091,074 | B2 * | 8/2006 | Han et al. | 438/197 |
| 7,671,421 | B2 * | 3/2010 | Chen et al. | 257/369 |
| 2004/0157385 | A1 | 8/2004 | Ikezawa | |
| 2005/0258468 | A1 * | 11/2005 | Colombo et al. | 257/314 |
| 2006/0205133 | A1 * | 9/2006 | Trivedi et al. | 438/199 |

FOREIGN PATENT DOCUMENTS

| JP | 10-50862 A | 2/1998 |
|---|---|---|
| JP | 2004-266249 A | 9/2004 |
| JP | 2003-506866 A | 3/2008 |

* cited by examiner

*Primary Examiner*—Shouxiang Hu
(74) *Attorney, Agent, or Firm*—Westerman, Hattori, Daniels & Adrian, LLP

(57) ABSTRACT

A method of manufacturing a semiconductor device has forming a first silicon film over the first insulating film, forming a second silicon film over the first silicon film, a first etching the second silicon film in a depth, which the first silicon film is not exposed, in first condition, a second etching a remaining portion of the second silicon film and the first silicon film in a depth, which the first insulating film is not exposed, in second condition which gives a higher vertical etching component ratio than the first condition; and a third etching a remaining portion of the first silicon film in third condition which an etching rate for the first silicon film is larger than an etching rate for the first insulating film as compared to the second condition, wherein an impurity concentration of a first conductivity type of the first silicon film is higher than an impurity concentration of first conductivity type of the second silicon film.

18 Claims, 8 Drawing Sheets

METHOD OF FORMING A GATE LAYER WITH MULTIPLE ECTHING STEPS

CROSS-RELATED APPLICATION

This application claims priority to Japanese Patent Application 2007-072343, filed Mar. 20, 2007, and is fully incorporated herein by reference in its entirety.

FIELD OF THE INVENTION

The present invention relates to a semiconductor device and a method of manufacturing the same and, more particularly, a semiconductor device having a conductive pattern and a method of manufacturing the same.

BACKGROUND OF THE INVENTION

In a step of forming a gate electrode of a MOS transistor, which constitutes a semiconductor device, from a silicon film, an n-type or p-type impurity is implanted into the silicon film.

An impurity concentration distribution, a depth, etc. demanded of a gate electrode for ensuring conductivity and source/drain regions serving as a carrier moving area are different respectively. For this reason, such a process is now studied that an impurity ion implantation applied to the silicon film constituting the gate electrode and an impurity ion implantation to form the source/drain regions in a silicon substrate are not carried out simultaneously.

This process contains respective steps of growing a polysilicon film over a silicon substrate via a gate insulating film, then implanting the impurity ion into the polysilicon film, and then patterning the polysilicon film into a gate shape by the photolithography method.

When a film thickness of the polysilicon film becomes thick, an impurity concentration in the lower layer portion is lacking, then a depletion layer is increased in the gate electrode, and thus an effective film thickness of the gate insulating film is increased. As a result, a reduction in performances of the MOS transistor is caused.

In contrast, when acceleration energy is enhanced to introduce an impurity into the thick polysilicon film at an enough depth, an amount of impurity that breaks through the gate insulating film is increased. Thus, there exists such a problem that a leakage current is ready to flow from the gate electrode.

Meanwhile, a film thickness of the gate electrode is set also taking account of optimization of a width and a film thickness of the sidewall spacer formed on its side surface. Thus, it is difficult to widen the width of the sidewall spacer when the polysilicon film becomes thin.

The sidewall spacer is formed by steps of forming an insulating film on the gate electrode and the silicon substrate and then anisotropically etching the insulating film to leave it on side surfaces of the gate electrode. This sidewall spacer is used to protect an extension region of the source/drain regions. The width of the sidewall spacer depends on a height of the gate electrode.

SUMMARY OF THE INVENTION

According to an aspect of the invention, a method of manufacturing a semiconductor device has steps of forming a first silicon film over the first insulating film, forming a second silicon film over the first silicon film, first etching the second silicon film in a depth such that the first silicon film is not exposed, in a first condition, second etching a remaining portion of the second silicon film and the first silicon film in a depth such that the first insulating film is not exposed, in a second condition which gives a higher vertical etching component ratio than the first condition, and third etching a remaining portion of the first silicon film in a third condition, in which a ratio of an etching rate for the first silicon film to an etching rate for the first insulating film is larger than that in the second condition, wherein an impurity concentration of a first conductivity type in the first silicon film is higher than an impurity concentration of the first conductivity type in the second silicon film.

BRIEF DESCRIPTION OF THE DRAWINGS

The invention will be described in connection with non-limiting embodiments with reference to the accompanying drawings.

DESCRIPTION OF THE PREFERRED EMBODIMENT

An embodiment of the present invention will be described in detail with reference to the drawings as below. In the following description, for purposes of explanation, specific nomenclature is set forth to provide a thorough understanding of the various inventive concepts disclosed herein. However, it will be apparent to those skilled in the art that these specific details may not be required in order to practice the various inventive concepts disclosed herein.

The inventor of the present invention has found the fact that, when an impurity concentration in a lower layer portion of a polysilicon film constituting a gate electrode is enhanced to suppress expansion of the depletion layer in the gate electrode, the side etching may be increased in this lower layer portion so that an effective length of the gate electrode is reduced.

The reason for this may be considered that, when an impurity concentration is increased beyond a predetermined range, an etching rate is increased.

The influence on the transistor characteristics by the side etching of the gate electrode is increased as the width of the gate electrode is narrowed up to several tens nm.

It is an object of the present invention to provide a semiconductor device and a method of manufacturing the same, capable of provide uniformly-sized widths of a lower layer portion and an upper layer portion of conductive patterns formed of silicon.

According to an embodiment of the present invention, a second silicon film, which is formed on a first silicon film containing the first conductivity type impurity at a high concentration, in an area exposed from a mask is etched in a depth such that the first silicon film is not exposed to outside, then a remaining portion of the second silicon film and most of the first silicon film are etched in the etching condition that shows a high anisotropy in the vertical direction, and then a remaining portion of the first silicon film is etched in the condition that gives a high selective etching ratio to the insulating film under the first silicon film.

As a result, the side etching of the first silicon film can be suppressed, the widths of the patterns formed of the first and second silicon films can become substantially uniform or approximately equal at any positions in the thickness direction, and a target line width of the patterns can be obtained.

An embodiment of the present invention will be described in detail with reference to the drawings as below.

Figure 1A:
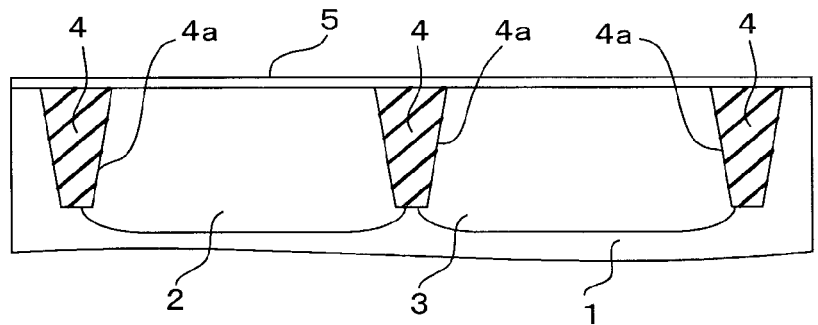
FIGS. 1A to 1U are sectional views showing steps of forming a semiconductor device according to an embodiment of the present invention.
Figure 1B:
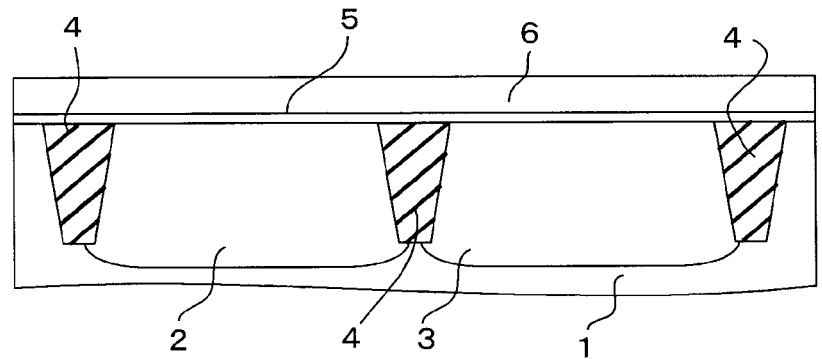
Figure 1C:
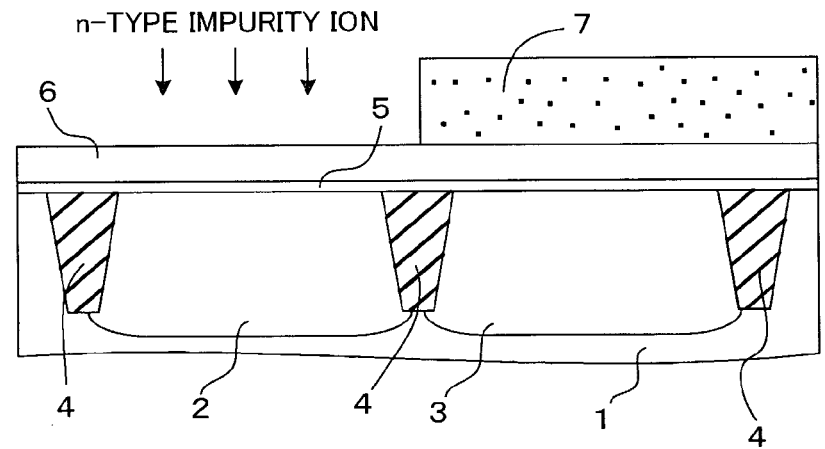
Figure 1D:
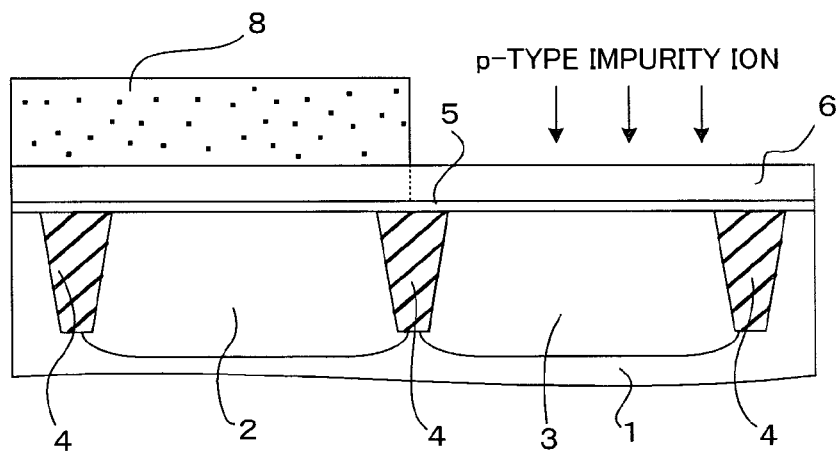
Figure 1E:
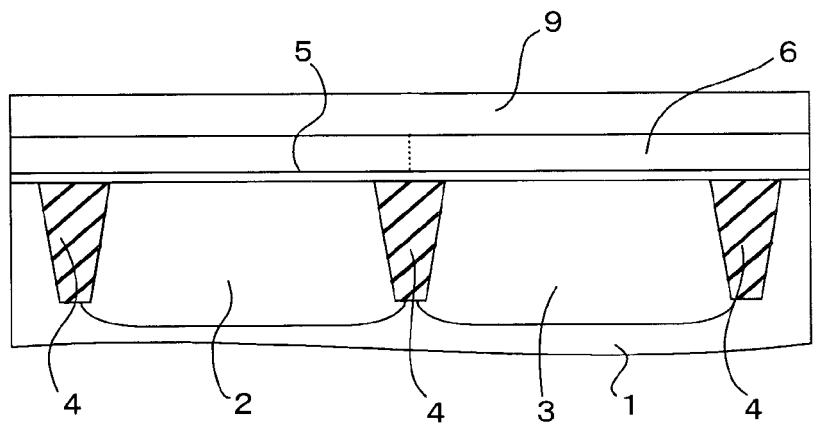
Figure 1F:
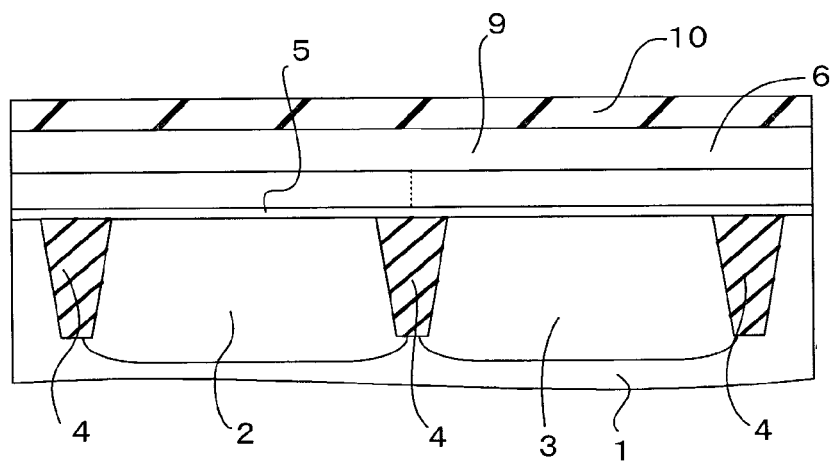
Figure 1G:
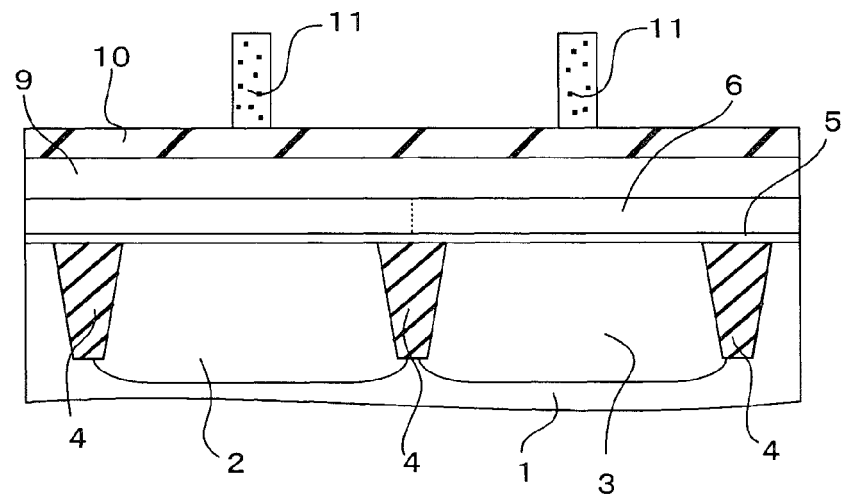
Figure 1H:
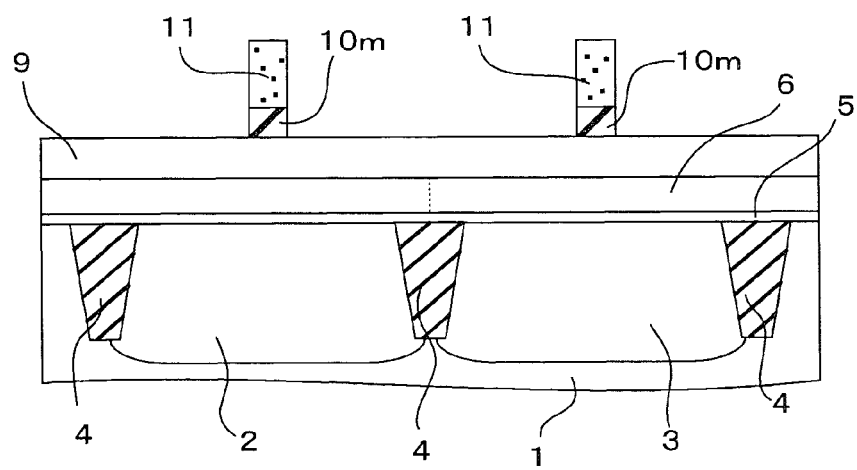
Figure 1I:
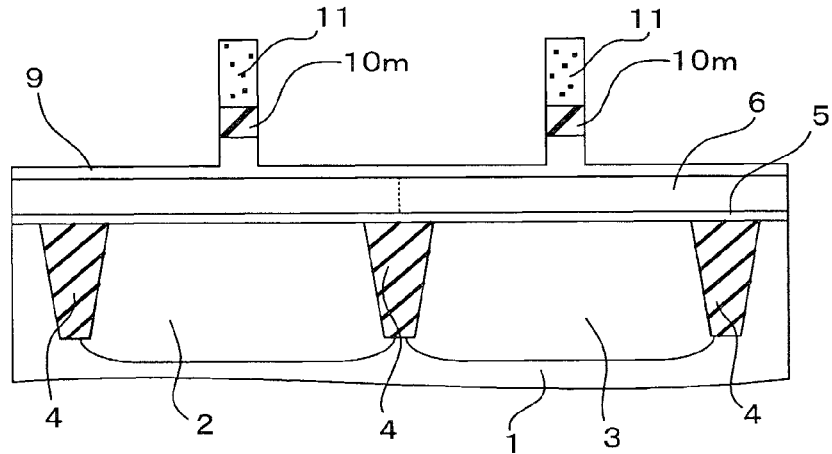
Figure 1J:
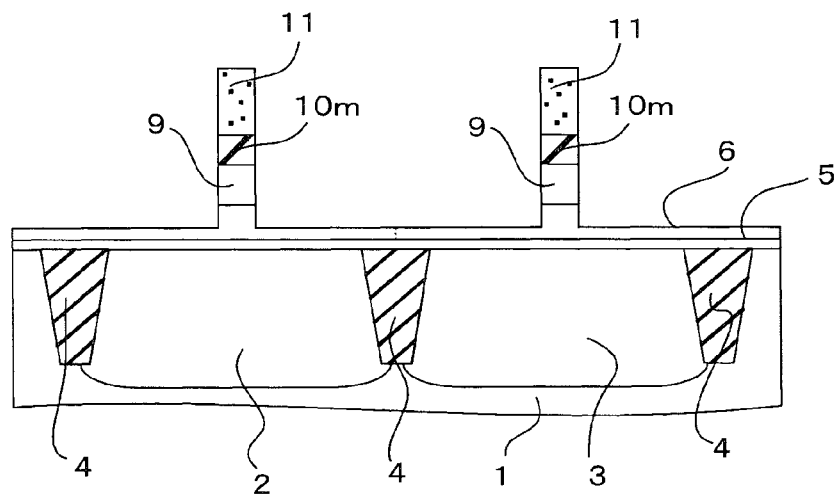
Figure 1K:
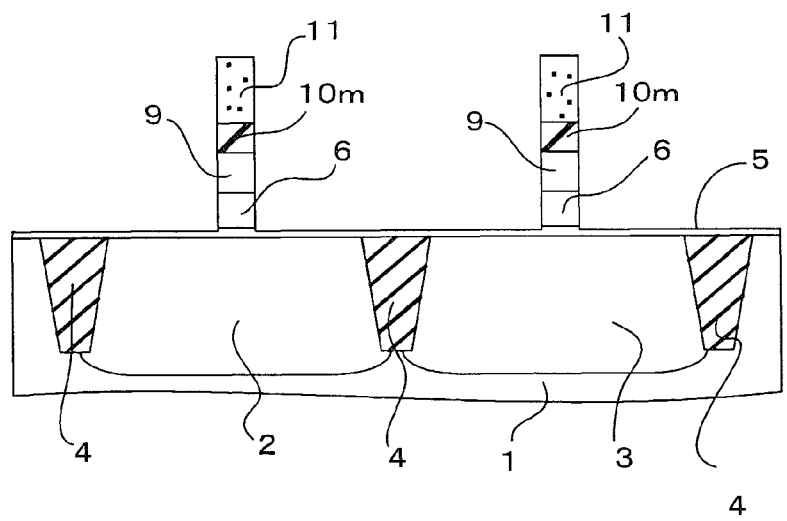
Figure 1L:
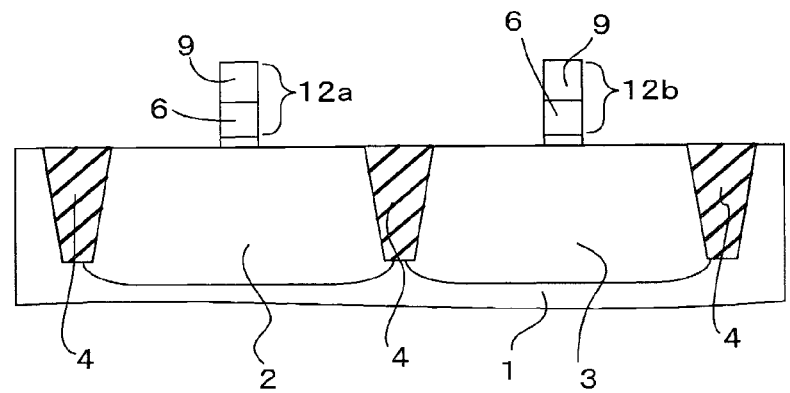
Figure 1M:
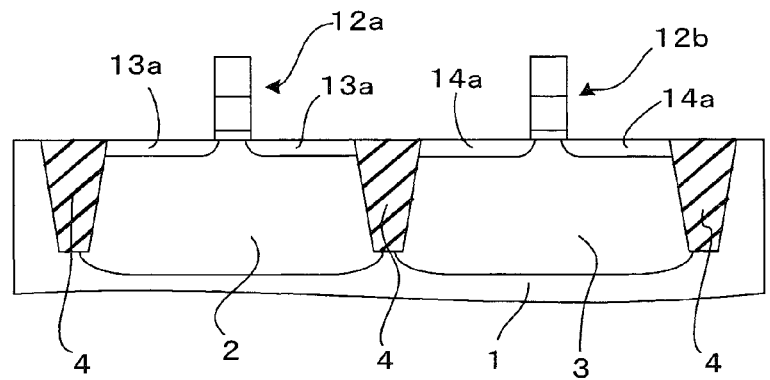
Figure 1N:
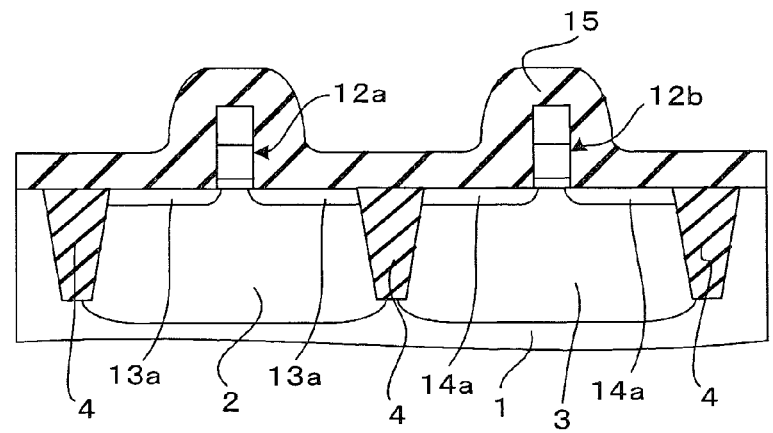
Figure 1O:
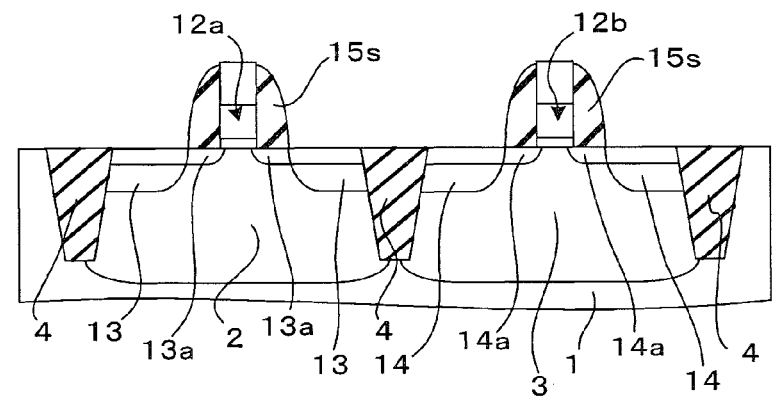
Figure 1P:
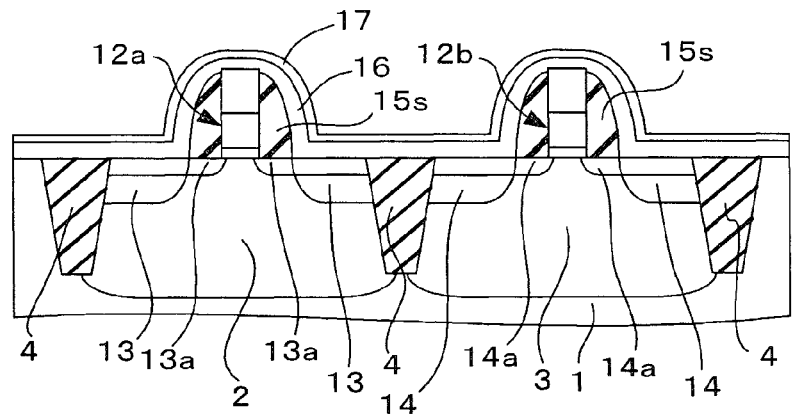
Figure 1Q:
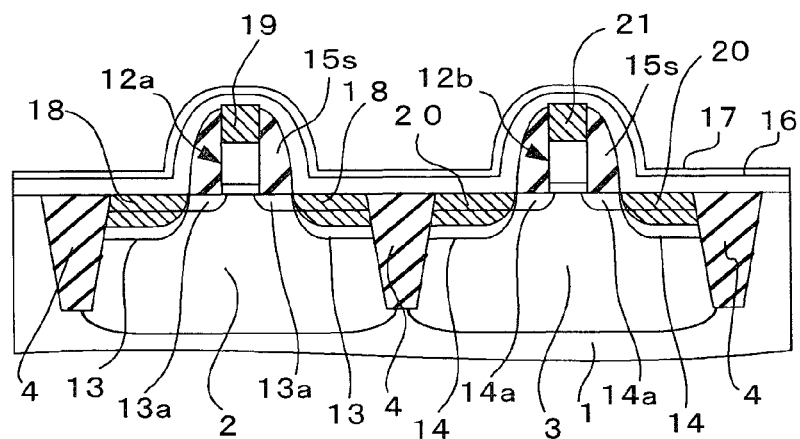
Figure 1R:
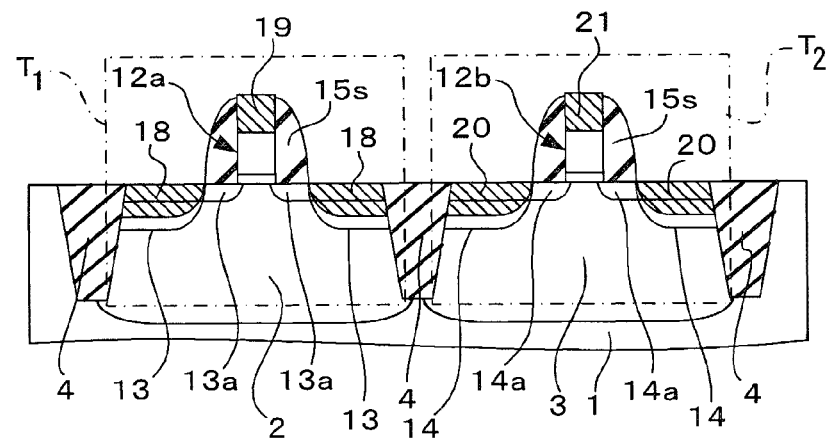
Figure 1S:
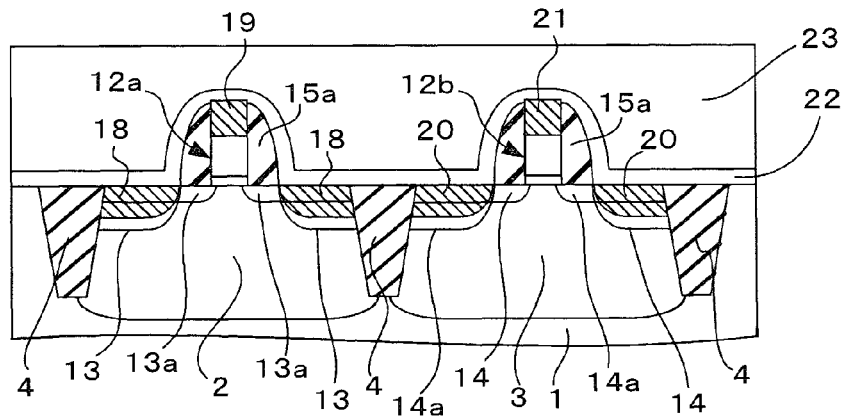
Figure 1T:
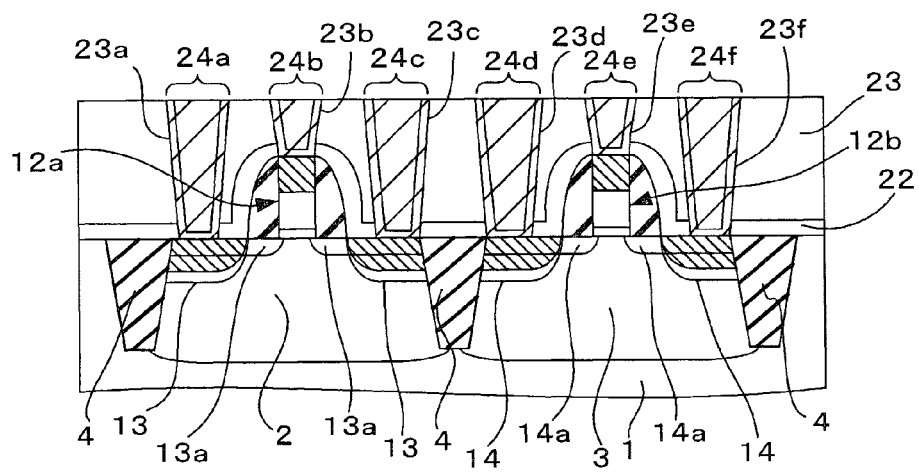
Figure 1U:
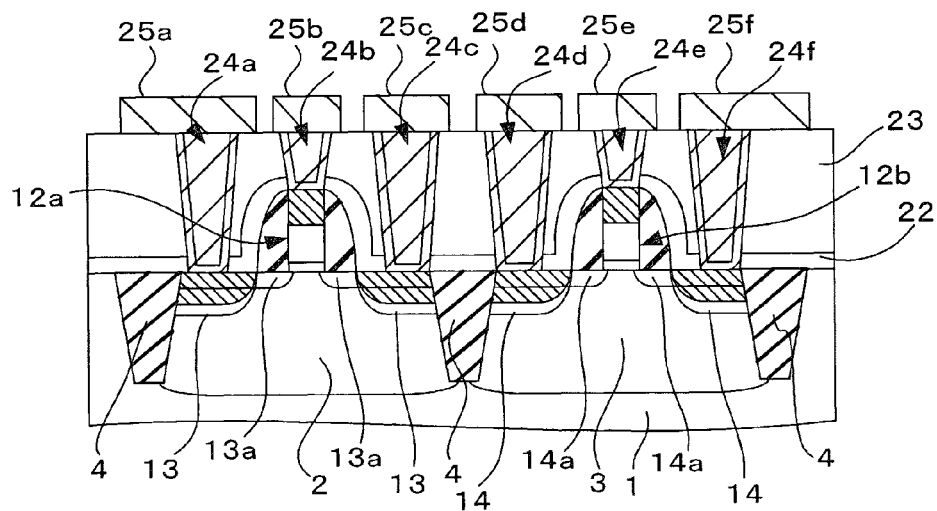

FIGS. 1A to 1U are sectional views showing steps of forming a semiconductor device according to an embodiment of the present invention. In the preferred embodiment, an improved method will be described in detail with respect to the example of the manufacturing the semiconductor device. It should be noted that the invention is not limited to a semiconductor device.

First, as shown in FIG. 1A, a P-well 2, an N-well 3, and element isolation layers 4 are formed on a semiconductor substrate, for example a silicon substrate 1.

The P-well 2 is formed by steps of forming a resist pattern (not shown) having an opening in a P-well region over the silicon substrate 1 and then ion implanting a p-type dopant in the silicon substrate 1 through the opening. As the p-type dopant, for example, boron (B) is employed. As the ion implanting condition of boron, for example, an acceleration energy is set to 120 keV and a dosage is set to $1\times10^{13}/cm^2$.

Also, the N-well 3 is formed by ion-implanting an n-type dopant into an N-well region with use of the resist pattern. As the n-type dopant, for example, phosphorus (P) is employed. As the ion implanting conditions of phosphorus, for example, an acceleration energy is set to 300 keV and a dosage is set to $1\times10^{13}/cm^2$.

After forming the P-well 2 and the N-well 3, shallow trench isolation (STI) is formed in the silicon substrate 1 as the element isolation layer 4. The STI forming process includes respective steps of forming a silicon nitride film (not shown) having openings in element isolation regions over the silicon substrate 1, forming trench 4a in the silicon substrate 1 by etching the portion not covered with the silicon nitride film, removing the silicon nitride film by a phosphoric acid, and burying a silicon oxide film in the trench 4a. The silicon oxide film formed over an upper surface of the silicon substrate 1 is removed by the chemical mechanical polishing (CMP) method, or the like.

In this case, instead of the formation the STI, the silicon oxide film may be formed by the Local Oxidation of Silicon (LOCOS) method as the element isolation layer 4.

Finally, a silicon oxide film of 1 nm to 2 nm thickness, for example, is formed as a gate insulating film 5 on the upper surface of the silicon substrate 1 by the chemical vapor deposition (CVD) method. In this case, other elements may be added to the silicon oxide film, and its thickness may be set to 1 nm to 2 nm in terms of the silicon oxide film.

Then, as shown in FIG. 1B, a first silicon film 6 is formed by the CVD method to have a thickness of 30 nm or more but 60 nm or less, for example. As a reaction gas used to grow the first silicon film 6, monosilane, dichlorsilane, or the like is used. A pressure in the growing atmosphere is set to about 40 Pa.

Then, either of an amorphous silicon film and a polysilicon film may be employed as the first silicon film 6. For example, a growth temperature is set to about 620° C. when the polysilicon film is grown, while a growth temperature is set to 580° C. or less when the amorphous silicon film is grown.

Then, a photoresist is coated over the gate insulating film 5 and then exposed/developed. Thus, as shown in FIG. 1C, a first resist pattern 7 is formed. Accordingly, the first silicon film 6 over the N-well 3 is covered with the first resist pattern 7, but the first silicon film 6 over the P-well 2 is exposed.

Then, an n-type impurity is ion-implanted into the first silicon film 6 being exposed from the first resist pattern 7. As the n-type impurity, phosphorus (P) or arsenic (As) is used. For example, a dosage is set to $4\times10^{15}$ atoms/cm$^2$ and an acceleration energy is set to 10 keV.

Thus, an n-type impurity concentration in the first silicon film 6 is in excess of $1\times18$ atoms/cm$^3$ in a region over the P-well 2.

After the first resist pattern 7 is removed, again the photoresist is coated over the first silicon film 6 and exposed/developed. Thus, as shown in FIG. 1D, a second resist pattern 8 is formed for covering the first silicon film 6 over the P-well 2 and exposing the first silicon film 6 over the N-well 3.

Then, a p-type impurity is ion-implanting into the first silicon film 6 being exposed from the second resist pattern 8. As the p-type dopant, boron (B) is employed. For example, a dosage is set to $5\times10^{15}$ atoms/cm$^2$ and an acceleration energy is set to 2 keV.

Accordingly, a p-type impurity concentration in the first silicon film 6 is in excess of $1\times10^{18}$ atoms/cm$^3$ in a region over the N-well 3.

Then, the second resist pattern 8 is removed. Then, as shown in FIG. 1E, a second silicon film 9 is formed on the first silicon film 6 by the CVD method to have a thickness of 50 nm or more but 80 nm or less, for example.

The growth condition of the second silicon film 9 is set identical to those of the first silicon film 6 except a film thickness. Then, either the amorphous silicon film or the polysilicon film may be employed as the second silicon film 9, and respective growth temperatures are set equal to those of the first silicon film 6.

In the present embodiment, the step of ion-implanting the impurity is not applied to the second silicon film 9, and the second silicon film 9 is kept in its undoped state until it is patterned. However, the first conductivity type impurity in the second silicon film 9 may be ion-implanted at a lower concentration than the first conductivity type impurity in the first silicon film 6. In this case, an impurity concentration after the ion implantation was made is set to below $1\times10^{18}$ atoms/cm$^3$.

Here, a total thickness of the first silicon film 6 and the second silicon film 9 is decided by considering a size of a lateral width of sidewalls, a resistance value of gate electrodes, etc. formed in later steps.

The impurity introduced into the first silicon film 6 may be activated before the growth of the second silicon film 9 or after the growth. The n-type impurity and the p-type impurity may be activated every time they are introduced. An activation temperature may be set to about 900 to 1000° C., for example.

Then, as shown in FIG. 1F, a hard film 10 is formed over the second silicon film 9. A titanium nitride (TiN) film is formed over the second silicon film 9 as the hard film 10, for example, by the sputter, and also a silicon oxide film is formed on the hard film 10 by the CVD method using a tetraethoxysilane (TEOS) gas.

Then, as shown in FIG. 1G, a photoresist is coated over the hard film 10 and then exposed/developed. Thus, a third resist pattern 11, which has gate electrode shapes over the P-well 2 and the N-well, is formed. In this case, a length of the third resist pattern 11 in the gate length direction is set to 30 nm to 60 nm, for example, over the P-well 2 and the N-well 3.

Then, as shown in FIG. 1H, the hard film 10 is patterned by etching and with the use of the third resist pattern 11 as a mask. Thus, the hard film 10 left under the third resist pattern 11 is used as a hard mask 10m, i.e. an etching mask.

In this case, the hard mask 10m is not essential, and the third resist pattern 11 may be formed directly on the second silicon film 9.

Then, the first silicon film 6 and the second silicon film 9 are patterned by plasma etching respectively under following conditions. These etchings are performed in the same chamber.

First, as shown in FIG. 1I, the second silicon film 9 in the region being not covered with the hard mask 10m is etched up to the middle of its thickness under the first etching conditions. An etching depth is set to 70% or more of the thickness of the second silicon film 9 such that the first silicon film 6 is not exposed to outside. However, the first silicon film 6 may be slightly exposed to outside.

As the etching gas in this case, any one of a mixed gas consisting of hydrogen bromide (HBr) and oxygen ($O_2$), a mixed gas consisting of chlorine ($Cl_2$), HBr, and $O_2$, and a mixed gas consisting of carbon tetrafluoride ($CF_4$), $Cl_2$, HBr, and $O_2$, for example, may be selected. Also, a pressure in the etching atmosphere is set to several mTorr or in a range of several mTorr or more but 10 mTorr or less.

The first etching condition may be constructed of two sub-steps. That is, when an oxide film is formed thin on the surface of the second silicon film 9, the condition using either $Cl_2$ or $CF_4$, for example, may be employed as the initial step.

Next, the condition of etching is changed into a second etching condition from the first etching condition. Then, as shown in FIG. 1J, a remaining portion of the second silicon film 9 is etched under the second etching condition in the area that is not covered with the hard mask 10m. Subsequently to this, the first silicon film 6 is etched up to the middle of the thickness.

An etching depth of the first silicon film 6 under the second etching condition is set to 20 nm or more such that the gate insulating film 5 is not exposed to outside. However, the gate insulating film 5 may be slightly exposed to outside. If the etching depth larger than the above is set, the gate insulating film 5 whose film thickness is thin is removed easily, and in turn the surface of the silicon substrate 1 is also etched. For this reason, it is necessary to prevent removal of the gate insulating film 5.

In the second etching condition, a gas obtained by adding $CH_xF_y$ (x, y are a number of atoms respectively) to at least one gas of $Cl_2$, HBr, hydrogen iodide (HI), and bromine ($Br_2$) is used as a reaction gas. As the $CH_xF_y$ gas, for example, a gas containing at least one of $CH_2F_2$, $CHF_3$, and $CH_3F$ may be used.

In this case, a pressure of the etching atmosphere is set relatively low such as 0.6 Pa, and also a power of a high-frequency power applied to the electrode opposing to the substrate is set to a high energy of 600 W, for example. As a result, an etching component in the direction perpendicular to the substrate is increased.

A flow rate of the $CH_xF_y$ gas is set to 2 to 5 flow-rate % of a total gas flow rate. Also, a flow rate of the HBr gas is set to 250 sccm, for example. Details of a flow rate of the $CH_xF_y$ gas will be described later.

Next, the condition of etching is changed into a third etching condition from the second etching condition. Thus, as shown in FIG. 1K, a remaining portion of the first silicon film 6 is etched in the region that is not covered with the hard mask 10m to expose the gate insulating film 5.

The third etching condition is set to the condition that can set highly a selective etching ratio of the first silicon film 6 to the oxide film constituting the gate insulating film 5, e.g., the silicon oxide film, to about 100 times, for example. Thus, in the final stage of the etching of the first silicon film 6, such a situation can prevent that the surface of the silicon substrate 1 is exposed.

As the etching gas in this case, a mixed gas of HBr and $O_2$, and helium (He) is used, and a pressure of the etching atmosphere is set to a high pressure, e.g., almost 10.7 Pa.

The third etching condition may be further divided into two sub-steps. In this case, in a second sub-step, an etching ratio of the silicon film to the silicon oxide film is enhanced rather than a first sub-step.

This is because a time of the side etching of the first silicon film 6 caused by a final overetching condition must be reduced as short as possible by changing the condition immediately before the gate insulating film 5 is exposed.

When the first silicon film 6 and the second silicon film 9 are patterned in the above etching conditions, an error of the pattern width in the gate length direction can be suppressed within 10%.

Then, the third resist pattern 11 is removed by the oxygen plasma or the solvent. Subsequently, as shown in FIG. 1L, the silicon oxide film constituting the hard mask 10m is removed by a buffer hydrofluoric acid, and the underlying TiN film is removed by a hot phosphoric acid. In this case, the TiN film may be removed by the anisotropic etching that is applied to form the sidewall spacer in the later step.

With the above, the patterns of the first silicon film 6 and the second silicon film 9 formed over the P-well 2 and the N-well 3 are used as a gate electrode 12a and a gate electrode 12b respectively.

The gate insulating film 5 in the area being not covered with the gate electrodes 12a, 12b is removed at the same time when the silicon oxide film constituting the hard mask 10m is removed. After this, a silicon oxide film (not shown) is grown on the surface of the silicon substrate 1 by the thermal oxidation method.

Then, as shown in FIG. 1M, an n-type extension region 13a is formed in the P-well 2 on both sides of the gate electrode 12a. Also, a p-type extension region 14a is formed in the N-well 3 on both sides of the gate electrode 12b.

The n-type extension region 13a is formed by ion-implanting the arsenic into the P-well 2 in a state that the region over the N-well 3 is covered with a photoresist (not shown), for example. In this case, for example, an acceleration energy of 1 keV and a dosage of $1 \times 10^{15}/cm^2$ are set as the condition for the As ion implantation.

Then, the photoresist for covering the N-well 3 is removed, and then the P-well 2 is covered with another photoresist (not shown). Then, boron is ion-implanted into the exposed N-well 3. Thus, the p-type extension region 14a is formed in the N-well 3 on both sides of the gate electrode 12b. For example, an acceleration energy of 0.5 keV and a dosage of $1 \times 10^{15}/cm^2$ are set as the condition for the B ion implantation.

Then, the photoresist for covering the P-well 2 is removed. Then, the silicon oxide film (not shown) is removed from the surface of the silicon substrate 1 except underlying areas of the gate electrodes 12a, 12b by a hydrofluoric acid, for example.

Then, as shown in FIG. 1N, an insulating film 15 of 90 nm thickness, for example, is formed over the silicon substrate 1 and the gate electrodes 12a, 12b by the CVD method. In this case, one layer of a silicon oxide film or two layers of a silicon oxide film and a silicon nitride film are formed as the insulating film 15.

When the first silicon film 6 or the second silicon film 9 is formed in an amorphous state, the amorphous silicon may be crystallized by the rapid thermal annealing (RTA), for example, to change a volume after the step in FIG. 1N. Thus, a stress is applied to channel regions under the gate electrodes 12a, 12b and a mobility of the carrier is improved.

Then, as shown in FIG. 1O, the insulating film 15 is etched back such that this insulating film 15 is left on both side portions of the gate electrodes 12a, 12b as a sidewall spacer 15s respectively.

Then, the N-well 3 and the P-well 2 are covered alternately with a photoresist (not shown). Then, the impurity of an opposite conductivity type is ion-implanted into the N-well 3 and the P-well 2 on the exposed area respectively. Accordingly, an n-type source/drain regions 13 and a p-type source/drain regions 14 are formed in the regions being not covered with the gate electrodes 12a, 12b and the sidewall spacers 15s respectively.

For example, the n-type source/drain regions 13 are formed on both sides of the gate electrode 12a by ion-implanting As into the P-well 2. In this case, for example, an acceleration energy of 35 keV and a dosage of $2\times10^{15}/cm^2$ are set as the condition for the As ion implantation.

Also, the p-type source/drain regions 14 are formed on both sides of the gate electrode 12b by ion-implanting B into the N-well 3. In this case, for example, an acceleration energy of 6 keV and a dosage of $6\times10^{15}/cm^2$ are set as the condition for the B ion implantation.

Then, the dopants that are injected into the P-well 2 and the N-well 3 respectively are activated by annealing the silicon substrate 1.

Then, as shown in FIG. 1P, a nickel (Ni) film 16 is formed in thickness of 20 nm over the silicon substrate 1 by the sputter using a Ni target. Thus, the gate electrodes 12a, 12b, the P-well 2, and the N-well 3 are covered with the Ni film. Here, a refractory metal such as NiPt, or the like may be formed in place of Ni. A thickness of the Ni film 16 or NiPt film may be set to 8 nm or more, but the thickness is set to 200 nm at a maximum.

Then, a protection film 17 made of TiN is formed on the Ni film 16 by the sputter. The TiN is formed by using a titanium (Ti) target and a nitrogen gas. Here, Ti may be formed as the protection film 17 in place of TiN. Also, the formation of the protection film 17 may be omitted.

Here, prior to the formation of the Ni film 16, the surface of the silicon substrate 1 is cleaned by a buffer hydrofluoric acid. This cleaning is done in the condition that is applied to etch the silicon by a thickness of 5 nm in terms of the thermal oxide film.

Then, as shown in FIG. 1Q, the nickel and the second silicon film 9 are caused to react together by annealing the silicon substrate 1 at a temperature of 220° C. to 280° C. (e.g., 260° C.) for 30 second. Thus, silicide layers 18 and 19 are formed on the n-type source/drain regions 13 and the gate electrode 12a respectively in the P-well 2. Also, silicide layers 20 and 21 are formed on the p-type source/drain regions 14 and the gate electrode 12b respectively in the N-well 3. When the Ni film 16 is used, the silicide layers 18 to 21 are formed as a nickel silicide layer.

The silicide layers 19, 21 formed on the gate electrodes 12a, 12b reduce a resistance of the second silicon film 9. In this case, the impurity in the first silicon film 6 may be diffused into the lower layer of the second silicon film 9 by the annealing to lower an electric resistance.

Then, as shown in FIG. 1R, the protection film 17 and the unreacted Ni film 16 are removed by using a mixed solution of a sulfuric acid and a hydrogen peroxide, a mixed solution of a hydrochloric acid and a hydrogen peroxide, or the like. Then, the nickel and the silicon are caused to react together by annealing the silicide layers 18 to 21 in a temperature range of 300° C. to 500° C.

In this case, the constitutive material of the silicide layers 18 to 21 is not limited to the nickel silicide or the nickel alloy silicide. A cobalt silicide layer ($CoSi_2$) or a titanium silicide layer ($TiSi_2$) may be formed by using a cobalt (Co) film or a Ti film instead of the Ni film 16.

With the above, an NMOS transistor $T_1$ having the gate electrode 12a, the n-type source/drain regions 13, and the like is formed in the P-well 2. Also, an NMOS transistor $T_2$ having the gate electrode 12b, the p-type source/drain regions 14, and the like is formed in the N-well 3.

Then, as shown in FIG. 1S, a silicon nitride film ($SiN_{y1}$ film (y1; composition ratio)) 22 and a silicon oxide film 23 are formed over the silicon substrate 1 by the plasma CVD method to have a thickness of 50 nm and a thickness of 600 nm respectively. In this case, a growth temperature of the silicon nitride film 22 and the silicon oxide film 23 is set to 400° C., for example. The silicon nitride film 22 and the silicon oxide film 23 serves as an interlayer insulating film. For the purpose of stress control in the channel portion, a nitride film having a tensile stress or a nitride film having a compressive stress may be used as the silicon nitride film 22.

Then, the silicon oxide film 23 is polished by the CMP to planarize its upper surface.

Then, a photoresist (not shown) is coated over the silicon oxide film 23 and then exposed/developed. Thus, openings (not shown) are formed in the photoresist on the silicide layers 18 to 21 formed on the gate electrodes 12a and 12b, the n-type source/drain regions 13, and the p-type source/drain regions 14 respectively.

Then, the silicon oxide film 23 and the silicon nitride film 22 are etched through the openings in the photoresist. Thus, as shown in FIG. 1T, contact holes 23a to 23f are formed in the silicon oxide film 23 and the silicon nitride film 22.

In this step, the silicon oxide film 23 is etched by the dry etching using a $C_{x2}F_{y2}/Ar/O_2$-based (x2, y2; number of atoms) gas. Also, the silicon nitride film 22 is etched by the dry etching using a $C_{x3}F_{y3}/O_2/Ar$-based (x3, y3; number of atoms) gas.

Then, a Ti layer of 2 nm to 8 nm thickness is formed as a glue layer on inner wall surfaces and bottom surfaces of the contact holes 23a to 23f and the silicon oxide film 23 by the plasma CVD method. Then, a TiN layer of 1 nm to 20 nm thickness is formed as a barrier metal layer on the Ti layer by the sputter.

Then, the W layer, the TiN layer, and the Ti layer are removed from an upper surface of the silicon oxide film 23 by the CMP. As a result, the W layer, the TiN layer, and the Ti layer left in the contact holes 23a to 23f act as conductive plugs 24a to 24f.

Then, as shown in FIG. 1U, a conductive film formed of a multi-layered structure consisting of a barrier metal and aluminum, for example, is formed on the silicon oxide film 23. Then, wirings 25a to 25f are formed by patterning the conductive film by means of the photolithography method.

Then, an interlayer insulating film, wirings, conductive plugs, etc. are formed over the wirings 25a to 25f and the silicon oxide film 23. Details of the processes will be omitted herein.

Figure 2:
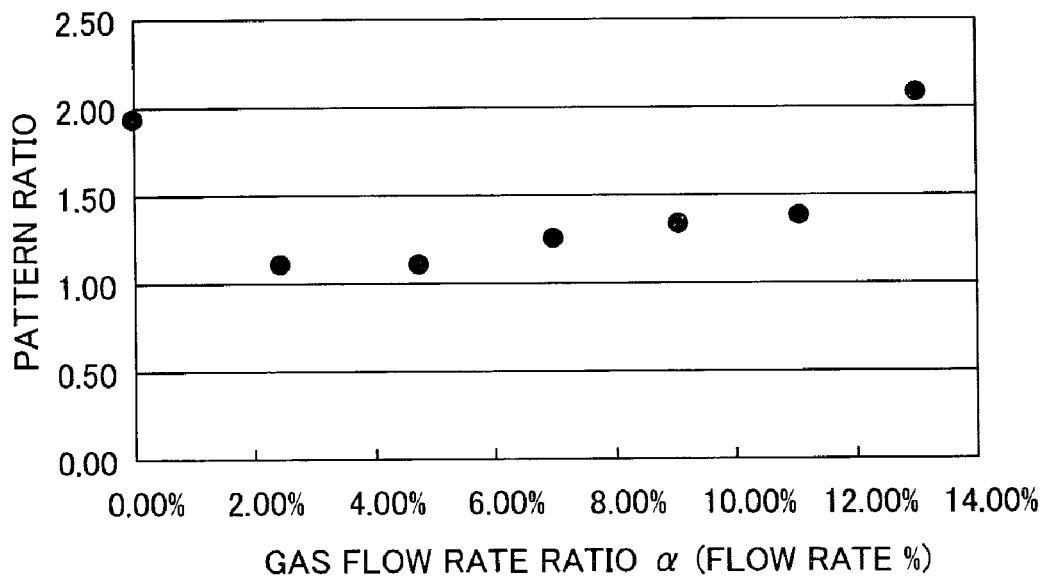
FIG. 2 is a graph showing a relationship between a flow rate ratio α of a $CH_xF_y$ gas used in patterning a silicon film constituting the semiconductor device according to the embodiment of the present invention and a pattern profile.

Meanwhile, in the step of patterning the gate electrodes 12a and 12b, the reason why a flow rate of a $CH_xF_y$ gas used in the second etching condition is set to 2 to 5 flow rate % of a total gas flow rate was due to the effect of the experimental result shown in FIG. 2.

FIG. 2 shows a relationship between a flow rate ratio α of the $CH_xF_y$ gas and a pattern profile of the gate electrodes 12a and 12b.

Figure 3:
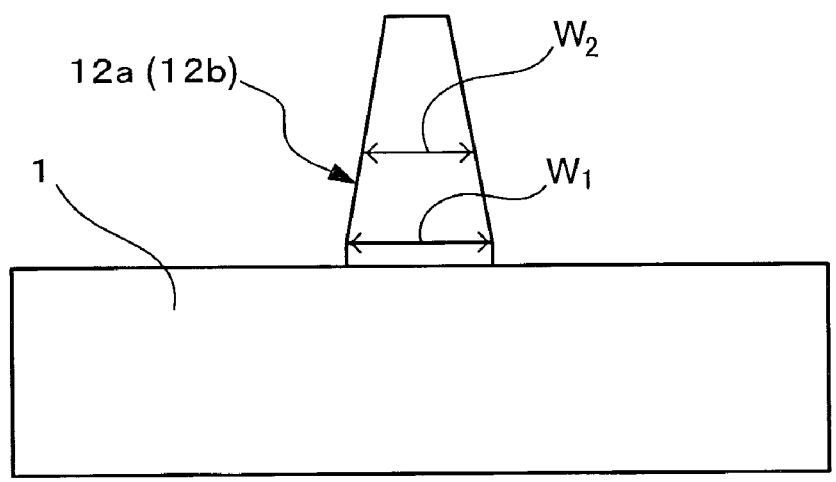
FIG. 3 is a sectional view showing a gate electrode constituting a MOS transistor.

In FIG. 2, an ordinate denotes a pattern ratio ($W_1/W_2$) of a width $W_1$ of the bottom surface to a width $W_2$ at the boundary between the first silicon film 6 and the second silicon film 9, e.g., in a center position of a height, in the gate electrode 12a or 12b shown in FIG. 3, and an abscissa denotes a flow rate ratio α of the $CH_xF_y$ gas.

When a pattern ratio is 1, a width of the gate electrode 12a or 12b is formed substantially uniform from the top to the bottom. Thus, a target line width of the gate electrode 12a or 12b can be attained.

The pattern ratio is desirable that it gets near to one (1). But it is appreciated that, since a tolerance of the patterning error is within 10%, for example, preferably a flow rate ratio α should be set to 2 flow rate % to 5 flow rate % based on the experimental result in FIG. 2.

In this manner, when a flow rate of the $CH_xF_y$ gas is set to 2 to 5 flow rate % of a total gas flow rate, a deposition layer is formed in its optimum condition on the side surface formed by the etching, during the etching of the first silicon film 6 with a high impurity concentration. Thus, the side etching is prevented and the tapered shape is hard to be formed.

Accordingly, it is preferable that the width at the boundary between the first silicon film 6 and the second silicon film 9 constituting the gate electrode 12a or 12b should be set to 90% or more of the width of the bottom surface of the first silicon film 6.

By the way, if the first etching condition is set identically to the second etching condition, a selective etching ratio of the second silicon film 9 to the third resist pattern 11 is degraded or an amount of fluorocarbon polymer attached to the side wall is too much to worsen a pattern precision, when the second silicon film 9 is etched from the upper surface.

As described above, according to the present embodiment, the etching conditions of the first etching condition applied to etch the second silicon film 9 that is undoped or has a low impurity concentration up to the middle of its thickness, the second etching condition applied to etch the first silicon film 6 up to the middle of its thickness from the middle of the second silicon film 9, and the third etching condition applied to etch the first silicon film 6 completely from the middle of the first silicon film 6 are changed respectively.

Since the second silicon film 9 is undoped or has a low impurity concentration, the side etching is hard to occur in the second silicon film 9 in contrast to the first silicon film 6. Thus, the first etching condition in which the deposition layer is hard to adhere to the side surfaces of the gate electrodes 12a and 12b, which appear gradually with the progress of the etching, are set as the etching condition of the second silicon film 9. Also, since an etching depth is set to 70% or more of the film thickness of the second silicon film 9 by optimizing an etching timing in the first etching condition, adhesion of the deposition layer is prevented and generation of the taper shape is suppressed. Therefore, a target line width is easily attained.

Also, a remaining portion of the second silicon film 9 and most of the first silicon film 6 are etched in the second etching condition. Therefore, the side etching of the first silicon film 6 with a high impurity concentration is suppressed, and a target line width is easily attained.

Also, an application range of the second etching condition is set to a range from the lower layer portion of the second silicon film 9 to at least 70% of the thickness of the first silicon film 6 with a high impurity concentration, e.g., up to a depth of 20 nm or more. Therefore, the influence of the side etching is prevented.

In this case, an impurity concentration in the first silicon film 6 is set to $1\times10^{18}$ atoms/cm$^3$ or more. When the impurity concentration is smaller than this value, a defective shape is seldom caused even by the etching in the first etching condition.

Further, in executing the overetching of the first silicon film 6, a selective etching ratio of the first silicon film 6 to the underlying gate insulating film 5 is set sufficiently high by etching the first silicon film 6 in the third etching condition. Therefore, the unnecessary etching of the silicon substrate 1 on both sides of the gate electrodes 12a, 12b is prevented.

In this manner, the etching conditions are changed at least three times. Therefore, an error of the shape of the gate electrodes 12a and 12b can be suppressed, and the optimum line width can be obtained by forming the pattern having a target width.

In the above embodiment, the gate electrodes 12a and 12b are formed by etching the first silicon film 6 and the second silicon film 9 while using a mask. But the wirings made of a silicon film, and other conductive patterns may be formed by employing the first to third etching condition.

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions described herein is merely illustrative, and the invention can be performed using different or additional process actions, or a different combination or ordering of process actions. As a further example, each feature of one embodiment can be mixed and matched with other features shown in other embodiments. Additionally and obviously, features may be added or subtracted as desired. Accordingly, the invention is not to be restricted except in light of the attached claims and their equivalents.

What is claimed is:

1. A method of manufacturing a semiconductor device comprising:
    forming a first insulating film over a semiconductor substrate;
    forming a first silicon film over the first insulating film;
    forming a second silicon film over the first silicon film;
    forming a mask layer in a predetermined pattern over the second silicon film;
    first etching the second silicon film in a depth such that the first silicon film is not exposed, in a first condition while using the mask layer as an etching mask;
    second etching a remaining portion of the second silicon film and the first silicon film in a depth such that the first insulating film is not exposed, in a second condition which gives a higher vertical etching component ratio than the first condition; and
    third etching a remaining portion of the first silicon film in a third condition of which a ratio of an etching rate for the first silicon film to an etching rate for the first insulating film is larger than that of the second condition,
    wherein an impurity concentration of a first conductivity type in the first silicon film is higher than an impurity concentration of the first conductivity type in the second silicon film.

2. The method of claim 1, wherein the second silicon film is etched in a depth which is 70% or more of a film thickness by the first etching.

3. The method of claim 1, further comprising:
    removing an oxide film over a surface of the second silicon film before the first etching.

4. The method of claim 1, wherein a first reaction gas used for the first etching includes HBr and $O_2$.

5. The method of claim 4, wherein the first reaction gas further includes $Cl_2$.

6. The method of claim 1, wherein a thickness of the first silicon film removed by the second etching is 20 nm or more.

7. The method of claim 1, wherein an impurity concentration of the first conductivity type in the first silicon film etched in the second etching is $1\times10^{18}$ atoms/cm$^3$ or more.

8. The method of claim 1, wherein a second reaction gas used for the second includes $CH_xF_y$ gas.

9. The method of claim 8, wherein the $CH_xF_y$ gas contains at least one of $CH_2F_2$, $CHF_3$, and $CH_3F$.

10. The method of claim 8, wherein the second reaction gas contains at least one of $Cl_2$, HBr, HI, and $Br_2$.

11. The method of claim 8, wherein a flow rate ratio of the $CH_xF_y$ gas to a total flow rate of the second reaction gas is 2 to 5 flow rate %.

12. The method of claim 1, wherein the third etching has a first step of executing an etching in the third condition, and a second step of executing an etching in fourth condition in which a ratio of an etching rate of the first silicon film to an etching rate of the first insulating film is set larger than the third condition.

13. The method of claim 1, wherein the first insulating film includes a silicon oxide.

14. The method of claim 1, wherein the first silicon film and the second silicon film are formed of either of a polysilicon film and an amorphous silicon film respectively.

15. The method of claim 1, further comprising:
after the third etching, removing the mask layer;
forming a metal film over the second silicon film; and
forming a metal silicide film over the second silicon film by heating the metal film and the second silicon film.

16. The method of claim 1, wherein the first silicon film and the second silicon film are patterned by the first etching, the second etching, and the third etching correspond to a gate electrode.

17. The method of claim 16, further comprising:
after the third etching, forming a second insulating film over an overall surface of the semiconductor substrate;
etching back the second insulating film to leave over side surfaces of the gate electrode as a sidewall spacer; and
forming the source/drain region by introducing an impurity into the semiconductor substrate while using the gate electrode and the sidewall spacer as a mask.

18. The method of claim 17, further comprising:
in a case that at least one of the first silicon film and the second silicon film is formed of amorphous film, after forming the second insulating film but before etching back the second insulating film, crystallizing the amorphous film by heating the first silicon film or the second silicon film.

* * * * *